(12) United States Patent
Gatzemeier et al.

(10) Patent No.: US 7,292,487 B1
(45) Date of Patent: Nov. 6, 2007

(54) INDEPENDENT POLLING FOR MULTI-PAGE PROGRAMMING

(75) Inventors: Scott N. Gatzemeier, Boise, ID (US); June Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/382,658

(22) Filed: May 10, 2006

(51) Int. Cl.
G11C 29/00 (2006.01)
(52) U.S. Cl. .................. 365/201; 365/49; 365/230.03
(58) Field of Classification Search ............... 365/235, 365/238.5
See application file for complete search history.

(56) References Cited

U.S. PATENT DOCUMENTS

| | | | |
|---|---|---|---|
| 4,190,885 A * | 2/1980 | Joyce et al. ............ 714/42 |
| 5,126,973 A | 6/1992 | Gallia |
| 5,511,029 A | 4/1996 | Sawada et al. |
| 5,696,917 A | 12/1997 | Mills et al. |
| 5,847,994 A | 12/1998 | Motoshima et al. |
| 5,959,929 A | 9/1999 | Cowles et al. |
| 5,966,388 A | 10/1999 | Wright et al. |
| 6,026,465 A | 2/2000 | Mills et al. |
| 6,101,139 A | 8/2000 | Dean |
| 6,104,667 A | 8/2000 | Akaogi |
| 6,104,668 A | 8/2000 | Lee |
| 6,144,598 A | 11/2000 | Cooper et al. |
| 6,185,128 B1 | 2/2001 | Chen |
| 6,208,564 B1 | 3/2001 | Yamada et al. |
| 6,246,609 B1 | 6/2001 | Akaogi |
| 6,246,626 B1 | 6/2001 | Roohparvar |
| 6,266,282 B1 | 7/2001 | Hwang et al. |
| 6,275,446 B1 | 8/2001 | Abedifard |
| 6,278,654 B1 | 8/2001 | Roohparvar |
| 6,285,962 B1 | 9/2001 | Hunter |
| 6,304,488 B1 | 10/2001 | Abedifard et al. |
| 6,304,497 B1 | 10/2001 | Roohparvar |
| 6,304,510 B1 | 10/2001 | Nobunaga et al. |
| 6,307,779 B1 | 10/2001 | Roohparvar |
| 6,307,790 B1 | 10/2001 | Roohparvar et al. |
| 6,314,036 B1 | 11/2001 | Cooper et al. |
| 6,314,049 B1 | 11/2001 | Roohparvar |
| 6,515,900 B2 | 2/2003 | Kato et al. |
| 6,530,045 B1 | 3/2003 | Cooper |
| 6,550,026 B1 | 4/2003 | Wright et al. |
| 6,552,934 B2 | 4/2003 | Roohparvar |
| 6,839,292 B2 | 1/2005 | Gatzemeier et al. |
| 6,854,079 B1 | 2/2005 | Cooper et al. |
| 6,870,770 B2 | 3/2005 | Roohparvar |
| 6,986,084 B2 | 1/2006 | Cooper et al. |

(Continued)

*Primary Examiner*—Tan T. Nguyen
(74) *Attorney, Agent, or Firm*—Schwegman, Lunberg & Woessner, P.A.

(57) ABSTRACT

A method of testing, polling and trimming memory pages in different memory banks simultaneously is presented, using a cache memory located in each one of the memory banks. The cache memory is at least as large as the individual memory pages and is used to record the programming voltage required to obtain the specified programming speed as well as the location of defective memory elements. A local on chip state machine may be used to accelerate the programming rate, and there may be a state machine per memory bank. With such an arrangement, the amount of testing time at wafer probe and final packaged device test may be reduced up to 40%, depending upon the number of memory pages tested in parallel.

30 Claims, 3 Drawing Sheets

U.S. PATENT DOCUMENTS

| | | |
|---|---|---|
| 7,013,413 B1 | 3/2006 | Kim et al. |
| 7,069,377 B2 | 6/2006 | Roohparvar |
| 2004/0128594 A1 | 7/2004 | Elmhurst et al. |
| 2005/0122831 A1 | 6/2005 | Roohparvar |
| 2006/0015691 A1 | 1/2006 | Louie et al. |
| 2006/0018179 A1* | 1/2006 | Marchal et al. ........ 365/230.03 |

* cited by examiner

INDEPENDENT POLLING FOR MULTI-PAGE PROGRAMMING

TECHNICAL FIELD

This application relates generally to semiconductor devices and device testing and, more particularly, to the programming of parallel electrical testing of portions of integrated circuit (IC) devices having regular arrays of cells, such as memory devices.

BACKGROUND

The semiconductor device industry has a market driven need to reduce the time required for function and speed testing of integrated circuits (ICs), in particular the high number of relatively low cost memory chips used in virtually every electronic device. Since each individual memory chip may be priced below that of the logic chips and microprocessors, and because of the large number of individual memory chips that may be used in a single electronic device, even a small reduction in overall chip cost has a large impact on the economics of both the chip manufacturer and the electronic device manufacturer. One method of reducing IC cost is to reduce the amount of time required to test each of the individual memory chips, both at wafer probe and at the finished packaged device stage at the back end of the line (BEOL).

Typically, memory chips such as dynamic random access memory (DRAM), static random access memory (SRAM), content addressable memory (CAM), and flash memory, are function tested by writing an array of binary one values (i.e., "1"), or writing an array of binary zero values (i.e., "0"), or writing alternating ones and zeros (i.e., a checkerboard), or a combination of these patterns. This is known as a single level cell, and there may also be multi-level memory cell arrays that may each store four or more different values (i.e., 0, 1, 2, 3) per cell, but the principle for testing these cells is similar.

In increase testing speed, memory chips may include "on chip" state machines (that is logic that can perform electrical operations on portions of the IC) that can write these test patterns into the memory sections of the chip as a self test and to reduce the testing time. A memory chip may have the total number of memory cells broken into groups in various ways. For example, a memory chip may have two or more banks of memory, where each bank may be broken into 2,048 blocks of memory, typically with 16 extra blocks of memory available for use as redundant memory blocks to replace defective blocks. Each block of memory may be broken down into 64 pages of memory, and each page may be formed of 1048 words, again typically with a number of redundant words to be used to replace defective words. Each word may, for example, have 32 individual bits of memory. In a function test, each of these bits must be tested to determine if the bits can be programmed to take the desired value in the allowable amount of time, at an allowable voltage level, and retain the programmed value.

In addition to simple function testing, the speed of the memory in writing and reading the data needs to be measured. For persistent memory types such as EEPROM or flash memory, the programming operation requires relatively high voltages for what is known as Fowler-Nordheim tunneling across the tunnel oxide to occur, and thus set the individual bits to either binary one or zero. After the speed of programming the memory bits is measured, the devices may be sorted into various groups, such as those that program much more rapidly than the specified rate at the normal programming voltage, those that program faster than the specified rate, and those that fail to program within the allowed time period at the normal programming voltage. It may be possible to improve the programming speed of the failed chip by increasing the programming voltage. This process may be known as trimming. All of the functional testing, the speed testing and sorting, may result in a cost of the IC chip that may reach 25% or more of the eventual IC cost. Thus, there is an industry wide problem in testing memory chips at a faster rate to reduce the cost per chip.

SUMMARY

The abovementioned issues are addressed by the present invention and will be understood by reading and studying the following specification.

An illustrative embodiment of the invention includes a method of testing memory devices, using the steps of dividing the memory elements into at least two memory banks, then dividing the memory banks into a plurality of memory pages of an approximate size. Each memory bank has a cache memory that is bigger than the memory page. The testing is performed by writing a pattern into one memory page and into the cache memory in each of the memory banks in parallel and comparing the pattern to the cache memory for differences. Any errors are stored, as well as a writing time period or the operation finish time for that memory bank, and the programming voltage or writing voltage used to do the programming. Then the testing is repeated for each one of the memory pages.

In one embodiment, the memory includes an onboard state machine or logic to perform testing, writing, comparing, storing and measuring steps in response to an external command. Such an arrangement may reduce the testing time at the expense of lost real estate on the memory chip. There may be a state machine for each of the memory banks that will be tested in parallel.

Measuring a writing time period for each of the memory pages, in an embodiment, also includes storing an operation finishing time for each of the memory pages, and thus uniquely identifying the operation finishing time for each page. Such an arrangement assists in evaluation and separating parts, and is useful in testing NAND flash memory. Such an arrangement may be useful in determining the use of redundant memory, in an embodiment, each memory page comprises 1048 16-bit words and 32 spare 16-bit words enabled as redundant memory elements, and each memory bank may have a redundant memory page.

In an illustrative embodiment, the tested memory is trimmed in response to measuring a writing time period greater than the specified maximum value. The programming voltage of the memory may then be incremented, with the increased voltage recorded in a portion of the non volatile memory of the device, and then may be page retested, until the writing voltage reaches a maximum programming voltage, or until the page passes the test. The recorded writing voltage level may be used to trim the device for operational use.

While the described illustrative embodiments are directed towards memory devices, the invention is not so limited and any electronic device having a repeated pattern of identical cells, such as optical imagers, may use the described method or apparatus. The test pattern written substantially simultaneously into the memory page in each memory bank may typically be a simple pattern such as writing digital zero values in every memory bit, or a digital one into each memory bit, or a checkerboard with a digital zero value written into every other memory bit. Other patterns may be used in memory testing or in other electronic device testing.

An illustrative embodiment includes a method of testing integrated circuits, by dividing the memory portions, or other repeating portions, of the integrated circuit into a number of banks, dividing the banks into a number of pages, and providing each bank with a page of memory to be used as a cache memory. Then a test pattern is programmed or written into one page in each one of the banks, as well as into the cache memories substantially simultaneously and in parallel. The test pattern written in each page is compared to the cache memory for that bank, measuring a programming time period for that page, and storing in a memory element the presence and location of any difference between the two patterns in the bank, the programming voltage and the programming time period. The test is repeated for each one of the pages. Typically, each memory element in the integrated circuit includes an input/output for each bank, and thus a current state of the writing, comparing, storing and measuring may be polled for each bank at any time in response to an external command. This can uniquely identify operation finish times and other significant information for each bank. In an embodiment, the time periods for each page are added to provide a bank programming time period, which may be use to bin, trim or otherwise segregate the integrated circuit.

Each page that is tested as having a programming time greater than a predetermined value may have the programming voltage incremented by a voltage value step, for example about 0.2 volts, and then repeat the test to see if the increased operating voltage will obtain a programming time less than the predetermined value, and so pass the part. This may be known as trimming. In an embodiment, the voltage is trimmed for the whole die rather than for each page, and is based upon a statistical function of the general distribution of measured page programming times. In an embodiment, the statistical function is the mode of the measured programming times. In an embodiment, the trimming is done by bank, rather than by the die as a whole. This process may continue until a maximum programming voltage is reached. An embodiment of a NAND flash memory has a predetermined value of programming time of about 0.5 milliseconds, an initial programming voltage of 17.0 volts, and a maximum programming voltage of 20.0 volts, in a memory page of 1048 16-bit words and 32 spare 16-bit words for use as redundant memory elements. There may also be a redundant memory page in each bank, to replace a page having more than 32 bad words, or a page having a programming time greater than the allowable maximum at the predetermined maximum programming voltage. In an embodiment, there is at least one memory block formed of 32 pages and 16 memory columns available as redundant memory elements for each memory bank.

In yet another illustrative embodiment of a method of independent page program polling a memory, the method provides each of a group of memory banks at least one cache memory that is at least as large as the largest of the pages of memory in that bank. Then the method simultaneously tests one page of memory in each of the banks of memory, and uniquely identifies a test finish time for each page of memory. The initial iteration of the test for each page of memory has a predetermined initial programming test voltage, and in response to the test finish time for that page of memory exceeding an upper value, the test is repeated at an incrementally higher programming test voltage, until either the test finish time is within the upper value and the page passes the test, or until the incrementally higher test voltage reaches a maximum voltage level, and the page fails the test. In the illustrative embodiment, the upper value of the test finish time is 0.5 milliseconds, an initial programming test voltage is 17.0 volts, the incrementally higher programming test voltage is 0.2 volts, and the maximum programming voltage level is 20.0 volts. In an embodiment, the trimming is not based upon a single page value, but rather is based upon a statistical function of at least several tested pages. The final iteration of this process is then based upon a statistical function, such as the mode, of all the measured page programming time, and if a page has reached the upper value of programming voltage, then the entire memory block of 32 pages is replaced with a redundant block.

In an embodiment of an apparatus for testing memory devices, there are means for addressing portions of memory elements of the memory devices and separating them into memory banks, with each memory bank divided into memory pages, and a cache memory that is at least as large as a largest one of the memory pages. There are also means for programming a test pattern into each one of the memory pages, where the test pattern is programmed into one memory page and into the cache memory of each one of the memory banks in parallel and simultaneously. There are means for comparing the test pattern in each memory page to the cache memory for that bank, measuring a programming time for that memory page, storing the presence and location of a difference between the memory page and the cache memory, the programming voltage and the programming finish time. This storage may be in a portion of the cache memory of the memory bank. There may also be input/output means for each of the plurality of memory banks, and means for polling a current state of the testing for each bank at any time in response to an external command.

The measured programming time period for each page may be added to provide a bank programming time period, and failed pages may have means for incrementing the programming voltage for each page having a programming time greater than the specified value and repeating the test until either a programming time less than the predetermined value is obtained, or a maximum programming voltage is exceeded. Typically, the predetermined value of is less than 0.5 milliseconds, an initial programming voltage is 17.0 volts, the programming voltage increment is 0.2 volts, and the maximum programming voltage is 20.0 volts.

Further, the apparatus may have means for replacing memory elements failing the test with redundant memory elements, including 32 redundant words per memory page, and at least one redundant memory page in each memory bank. The test patterns may be written and read via input/output (I/O) connections on the integrated circuit (IC) from an external controller, or there may be a state machine on the IC, or a state machine included in each memory bank to perform the testing, polling, binning or trimming operations.

These and other aspects, embodiments, advantages, and features will become apparent from the following description and the referenced drawings.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

An integrated circuit (IC), such as a NAND flash memory, contains large arrays of relatively similar cells. Electrical testing of these cells may include writing a specific pattern of digital information into the cells, which may be known as programming, and then reading the pattern and comparing the read pattern to the written pattern for differences. Electrical testing of IC devices may also include measurements of how long the programming and/or reading of the pattern takes to complete the operation, and the devices may be separated into different bins based upon the speed of the part. The programming operation typically occurs at a specific operating voltage, and parts that fail to meet the speed requirements at a minimum operating voltage, may operate fast enough to meet the specification at a slightly higher operating voltage. The devices may be binned based upon the required operating voltage levels, or they may record the required operating voltage in a non volatile portion of the memory, and use on chip voltage regulation devices to provide the required voltage to the chip during field operations. This may be known as trimming the device, and improves device yield, thus reducing cost. It would be advantageous to operate an IC chip at the lowest possible voltage due to power consumption issues in battery powered devices, device heating issues leading to reduced device life time, and reliability issues such as time dependent dielectric breakdown in MOS devices. Another potential benefit obtained with a lowest possible programming voltage for a memory circuit is known as program disturb, which may cause individual bits of a page to program that were not intended to be programmed, which may result in what appears to be a programming error. It would be a benefit to be able to operate a memory device using the lowest possible voltage level for each individual page of memory. In order to obtain this benefit it is necessary to be able to identify the write operation finish time uniquely for each page of memory in an IC, and trim the die, or the memory bank, based on the measured page data.

One of the costs of manufacturing electronic devices, such as memory chips, is the time utilized to electrically and functionally test the devices at probe, which determines which of the individual die on a wafer are working and within specification, and at the back end (BE) testing, which tests the finished devices in their packages or on their printed circuit boards (PCB). The testing costs consist of the use of the time of expensive test systems, special probe cards and sockets, tester technician and engineer time, and other typical expenses. It is believed that probe and BE testing represent about 20% of the total fabrication cost of large scale production devices, such as memory chips. Within the IC testing time, the time needed to program the test pattern represents as much as 42% of the total test time, and thus is a very large portion of the overall test cost. It would reduce the total test time by about 21% to be able to test two pages of memory in parallel rather than in series. Even greater benefits result from programming 3, 4 or 8 pages of memory in parallel, and it is possible to reduce the 42% of test time taken in programming to only 5%, by the use of parallel programming.

A potential issue with the use of parallel programming is the above noted need to know the programming time for each individual one of the memory pages in order to properly trim the devices. Thus a multi-page polling system would be beneficial for tester speed and cost, and an on chip state machine could provide improved speed and the ability to store the trim values for page operation. The state machine would most beneficially be embedded in or near each bank of memory pages, and the number of parallel pages that could be tested simultaneously would be limited to the number of memory banks, each with a state machine and a cache memory large enough to contain the test pattern and the trim settings for each page of memory. Alternatively, the trim could be done by bank, using the sum of all the pages to obtain a bank speed, or it could be done by die, using the stored page trim setting to determine a minimum die operation voltage. Yet further, the individual page trim settings may be used to substitute operational, but slow, pages with available redundant pages that were not necessary to replace defective pages.

Figure 1:
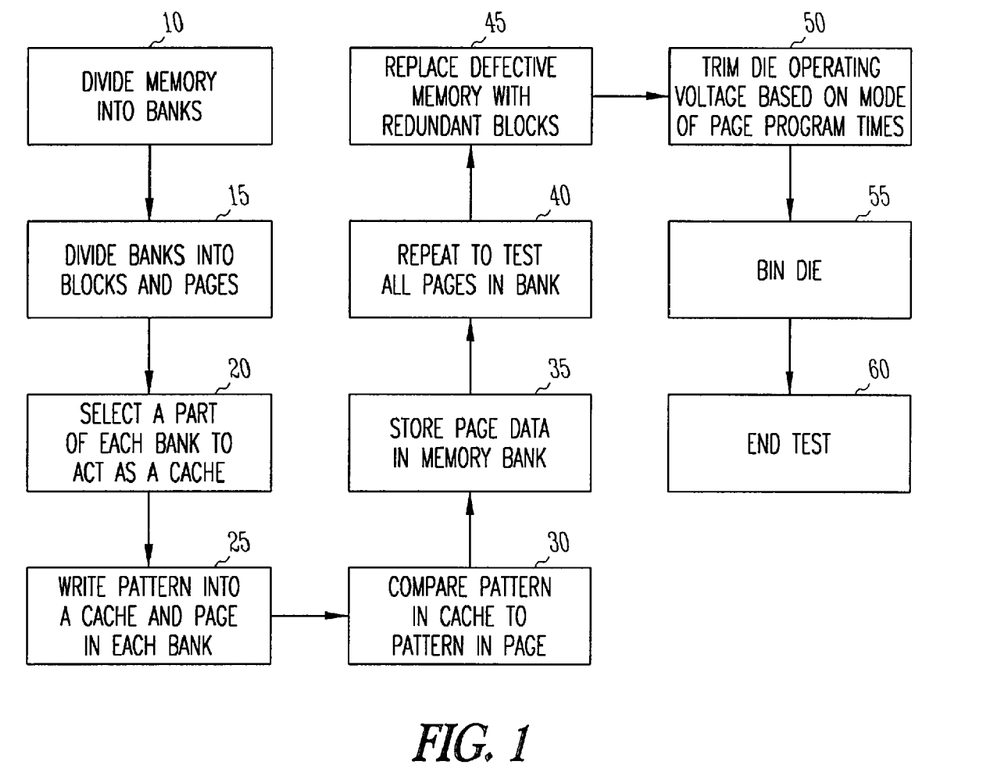
FIG. 1 is a flow chart according to an embodiment.

FIG. 1 is a flow chart showing a general embodiment of the method of the invention for illustrative purposes. Other operational flow arrangements may be easily imagined, and the present invention is not limited to the described illustrative method. The memory portion of the IC may be divided either physically or logically into a number of memory banks at 10. The banks are then divided into blocks and pages, with an illustrative embodiment of 64 pages per block, and one redundant block per bank at 15. A portion of each memory bank is selected to act as a cache memory at 20. Typically, a memory chip will have a cache region already available and the cache will be at least as large as the memory page to be tested. At 25 a test pattern, such as alternating logical ones and zeros is written simultaneously into the cache memory and one of the pages to be tested in each of the memory banks. At 30 the cache data, including in an embodiment programming finish time for the page, is compared to the page data and differences are noted, and stored in a portion of the memory. All of the pages are tested in the same fashion at 40, and their data is stored in the memory. If there are defective memory pages, they may be replaced at 45 with the redundant blocks. If there are pages that failed to program in the time allowed, then the die, or in an embodiment the memory bank, programming voltage is incremented by a small amount at 50, in an embodiment 0.2 volts, and the test is repeated until all pages program within the allowed time, or until the programming voltage has reached an upper limit, and the data is stored in the memory. The die are binned for function at 55 and the test ends at 60.

Figure 2:
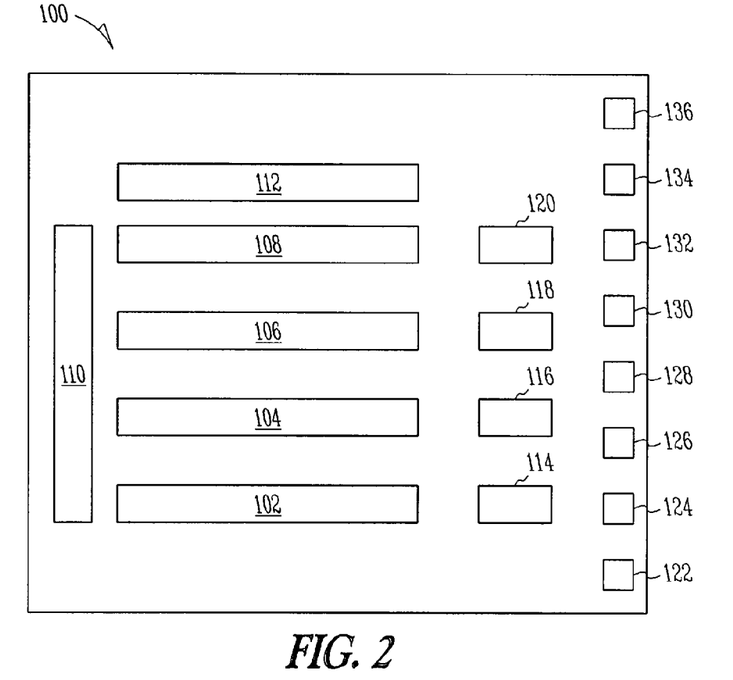
FIG. 2 illustrates an embodiment of an integrated circuit (IC) chip.

FIG. 2 illustrates an embodiment of an integrated circuit (IC) chip 100, for example a flash memory chip, where the memory is divided either physically or logically into four memory banks 102-108. There are redundant memory elements 110 and 112, which may be used to replace defective memory rows, or columns, or entire pages of defective memory. A typical illustrative embodiment of a memory arrangement may have 64 pages of memory to form a single erase block in a flash memory, and 2,048 pages per memory bank (i.e., 102-108). Each of the memory pages needs to be individually tested and have the voltage required to program the page recorded. A typical current specification level might be to require that each page of memory be programmable in less than 500 microseconds, or 0.5 ms, at a voltage of between 17 to 20 volts. In an embodiment, the mode of all the individual page programming times would be from 260 to 300 microseconds.

This illustrative embodiment has eight I/O pads (numbered 122-136 on one side of the IC 100) that would be used with, or in addition to, other I/O pads (or bonding pads) for communication between the IC 100 and the external world. One use of these eight I/O pads would be for polling the four memory banks 102-108 to determine the time that the programming of the page under test in each bank is completed. The ability to uniquely identify the finish time for each page is important to the trimming measurement and the eventual evaluation of the IC.

Each memory bank, 102-108 also has an associated cache memory, 114-120 respectively, which is at least as large as the individual memory pages that comprise the memory banks 102-108. The test pattern may be written into the memory banks 102-108, via a combination of the I/O pads 122-136 and other I/O pads (not shown), in this illustrative case as a four way parallel writing, although the invention may have any number of banks from two and up. In the illustrative embodiment, memory bank 102 might have a page programmed using pads 122 and 124 to provide the selected pattern, and so on for bank 104 and pads 126 and 128. The pads 122 and 124 may also be used to report the completion of programming the page of bank 102 as being complete in response to a polling signal.

Figure 3:
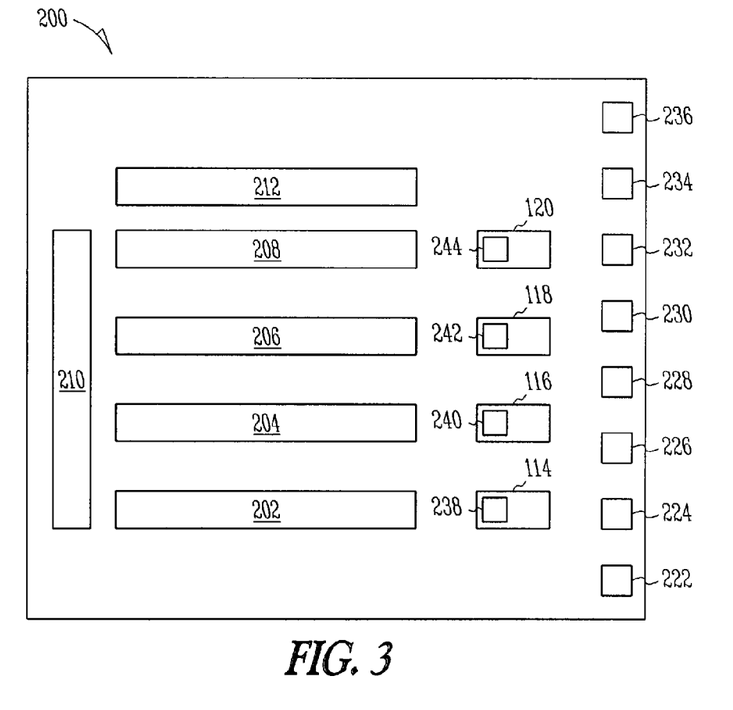
FIG. 3 illustrates a different embodiment of an integrated circuit (IC) chip.

FIG. 3 illustrates a second embodiment of an integrated circuit (IC) chip 200, with all the portions having the same identification as the similarly marked and numbered features of FIG. 1. In this illustrative embodiment, each of the caches 214-220, have an associated state machine 238-244, which may be embedded in the cache, may be located next to the cache, or may have only an electrical connection to the associated caches. The state machines 238-244 may be logic elements enabled to generate and evaluate test patterns for testing the individual pages of memory in the associated memory banks 202-208.

The use of state machines 238-244 removes the time required for the patterns to be programmed from an external source, and provides local capability to remove the need for constant external polling of the device under test. The state machines are beneficially associated and located with a single memory bank, as shown in the illustrative embodiment, but the invention is not so limited, a single state machine, located anywhere on the IC 200 may be used.

Figures 4, 5:
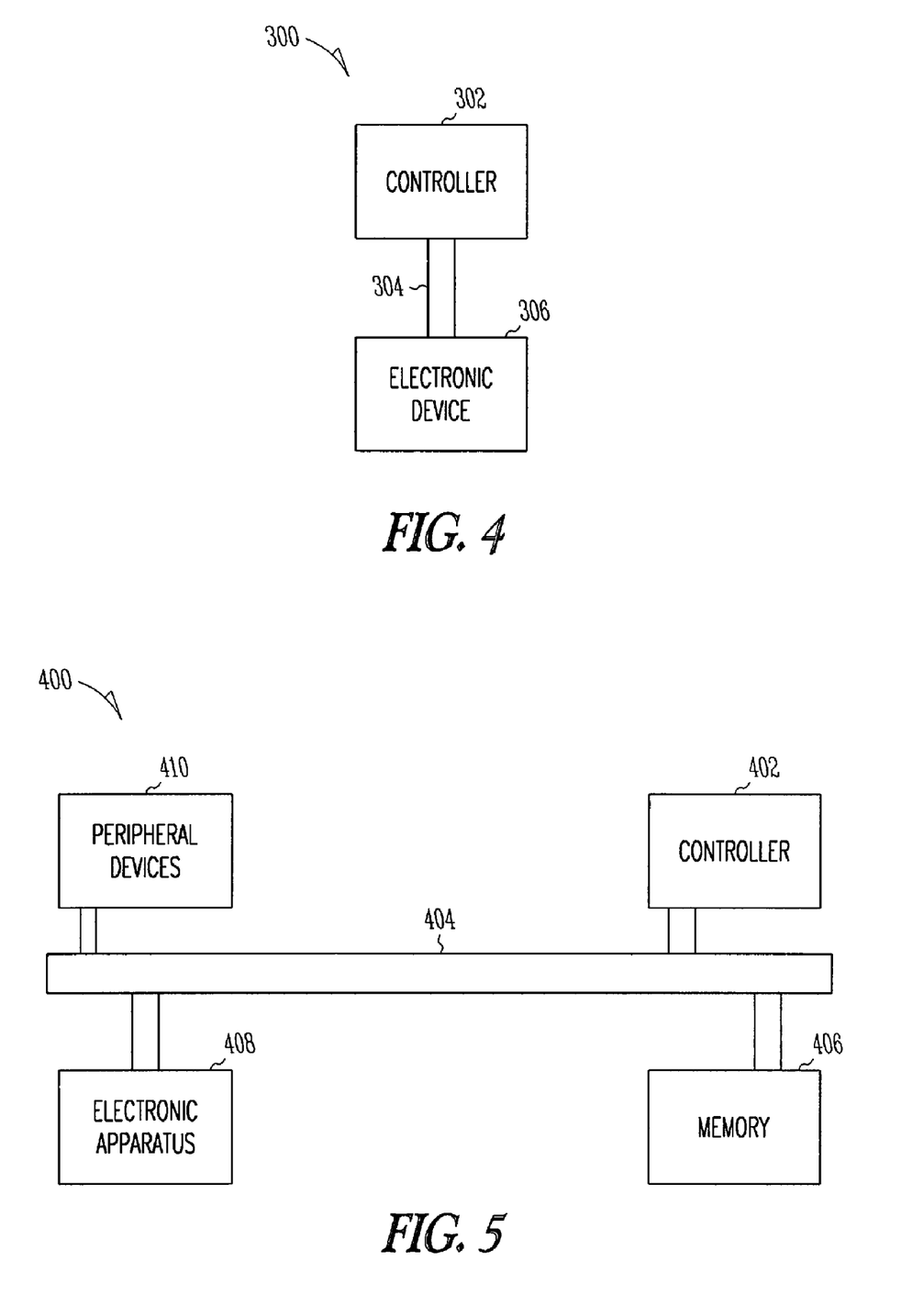
FIG. 4 illustrates an embodiment of a general electronic device.
FIG. 5 illustrates an embodiment of a general electronic device.

FIG. 4 is a block diagram of a general electronic device in accordance with an embodiment of the invention with an electronic system 300 having one or more devices tested according to various embodiments of the present invention. Electronic system 300 includes a controller 302, a bus 304, and an electronic device 306, where bus 304 provides electrical conductivity between controller 302 and electronic device 306. In various embodiments, controller 302 and/or electronic device 306 include an embodiment for a portion of the device having memory chips tested as previously discussed herein. Electronic system 300 may include, but is not limited to, information handling devices, wireless systems, telecommunication systems, fiber optic systems, electro-optic systems, computers and automatic testing equipment (ATE).

FIG. 5 depicts a diagram of an embodiment of a system 400 having a controller 402 and a memory 406. Controller 402 and/or memory 406 include a portion of the circuit having IC devices and memory chips tested in accordance with the disclosed embodiments. System 400 also includes an electronic apparatus 408, and a bus 404, where bus 404 may provide electrical conductivity and data transmission between controller 402 and electronic apparatus 408, and between controller 402 and memory 406. Bus 404 may include an address, a data bus, and a control bus, each independently configured. Bus 404 also uses common conductive lines for providing address, data, and/or control, the use of which may be regulated by controller 402. In an embodiment, electronic apparatus 408 includes additional memory devices configured similarly to memory 406. An embodiment includes an additional peripheral device or devices 410 coupled to bus 404. In an embodiment controller 402 is a processor. Any of controller 402, memory 406, bus 404, electronic apparatus 408, and peripheral device or devices 410 may include ICs tested in accordance with the disclosed embodiments. System 400 may include, but is not limited to, information handling devices, telecommunication systems, and computers. Peripheral devices 410 may include displays, additional memory, or other control devices operating with controller 402 and/or memory 406.

The described embodiments are directed towards memory devices such as NAND flash devices, and disclose binary logic levels of zero and one, but the invention is not so limited, and may be applied to non memory devices having regular arrays of cells, such as imaging devices, logic devices having embedded memory arrays or other repetitive cells, and logic devices using more than two voltage levels.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above structures and fabrication methods are used. The scope of the embodiments of the present invention should be determined with reference to the appended claims, along with the full scope of equivalents to which such claims are entitled.

What is claimed is:

1. A method of testing memory devices, comprising:
dividing the memory elements into at least two memory banks, each memory bank having a predetermined size;

dividing the memory banks into a plurality of memory blocks formed by a plurality of memory pages, each memory page having a predetermined size;

providing each memory bank with a memory portion having a greater size than the size of the memory page enabled as a cache memory;

writing a predetermined pattern into one of the plurality of memory pages in each one of the at least two memory banks substantially simultaneously, and into the cache memories;

comparing the written predetermined pattern to the cache memory for differences, and storing an identifier for each memory page indicating at least the presence and location of a difference, and measuring a writing time period for that memory bank; and returning to the steps of writing a predetermined pattern and repeating the method for each one of the plurality of memory pages.

2. The method of testing memory devices of claim 1, wherein the memory includes a state machine capable of performing the writing, comparing, storing and measuring steps in response to an external command.

3. The method of testing memory devices of claim 2, wherein the memory includes at least one state machine for each memory bank.

4. The method of testing memory devices of claim 1, wherein the measuring a writing time period for each of the memory pages further includes an operation finishing time for each of the memory pages.

5. The method of testing memory devices of claim 1, wherein the memory device comprises a NAND flash memory.

6. The method of testing memory devices of claim 5, wherein each memory page comprises 1048 16-bit words and 32 spare 16-bit words enabled as redundant memory elements, and each memory block comprises 64 memory pages.

7. The method of testing memory devices of claim 5, wherein the predetermined pattern written substantially simultaneously into the memory page in each one of the at least two memory banks comprises writing digital zero values in every memory bit.

8. The method of testing memory devices of claim 5, wherein a digital zero value is written in every other memory bit.

9. The method of testing memory devices of claim 1, wherein in response to the measuring a writing time period resulting in a time period greater than a stored maximum allowable value;

increasing a programming voltage of the memory by a predetermined voltage increment;

retesting the page, and recording the increased voltage increment in a portion of the memory of the device; and in response to a time period greater than the stored maximum value, repeating the voltage increment increase until the recorded voltage increment reaches a predetermined maximum programming voltage, and then storing an identifier for each memory page indicating a failed memory page.

10. The method of testing memory devices of claim 9, further including at least one redundant memory block comprising 64 memory pages enabled to replace a memory block containing at least one failed memory page.

11. A method of testing integrated circuits, comprising:

dividing the memory elements of the integrated circuit into a plurality of banks, dividing the plurality of banks into a plurality of pages, and providing each bank with a page enabled as a cache memory;

programming a test pattern into one of the plurality of pages in each one of the plurality of banks and into the cache memories substantially simultaneously;

comparing the test pattern in each page to the cache memory for that bank, measuring a programming time period for that page, and storing in a memory element the presence and location of a difference, the programming voltage and the programming time period; and repeating for each one of the plurality of pages.

12. The method of testing integrated circuits of claim 11, wherein the memory elements include an input/output for each of the plurality of banks, and a current state of the writing, comparing, storing and measuring may be polled for each bank at any time in response to an external command.

13. The method of testing integrated circuits of claim 12, wherein the programming time periods for each page are added to provide a bank programming time period.

14. The method of testing integrated circuits of claim 13, wherein each page having a programming time greater than a predetermined value has the programming voltage incremented by a value of 0.2 volts and repeats the test until either a programming time less than the predetermined value is obtained, or a maximum programming voltage is exceeded.

15. The method of testing integrated circuits of claim 14, wherein the predetermined value of programming time is 0.5 milliseconds, an initial programming voltage is 17.0 volts, and the maximum programming voltage is 20.0 volts.

16. The method of testing integrated circuits of claim 14, wherein all of the individual pages have programming times less than 0.3 milliseconds.

17. The method of testing integrated circuits of claim 16, further including at least one redundant page in each bank enabled to replace a page having more than 32 bad words, or a page having a programming time greater than a predetermined maximum at a predetermined maximum programming voltage.

18. The method of testing integrated circuits of claim 11, wherein the integrated circuit includes a NAND flash memory portion.

19. The method of testing integrated circuits of claim 11, wherein the test pattern written substantially simultaneously into the page in each one of the banks comprises writing a digital zero value into every individual memory bit.

20. The method of testing integrated circuits of claim 11, wherein a digital zero value is written into alternating memory bits.

21. A method of independent page program polling for a memory, comprising:

providing each individual one of a plurality of banks of memory with at least one cache memory that is at least as large as a largest one of a plurality of pages of memory contained in that bank of memory;

simultaneously testing one page of memory in at least two of the plurality of banks of memory; and uniquely identifying a test finish time for each page of memory.

22. The method of claim 21, wherein further an initial test for each page of memory has a predetermined initial programming test voltage; and in response to the test finish time for that page of memory exceeding an upper value, the test is repeated at an incrementally higher programming test voltage;

repeating until either the test finish time is within the upper value and the page passes the test, or until the incrementally higher test voltage reaches a maximum programming voltage level, and the page fails the test.

23. The method of claim 22, wherein the upper value of the test finish time is 0.5 milliseconds, an initial programming test voltage is 17.0 volts, the incrementally higher programming test voltage is 0.2 volts, and the maximum programming voltage level is 20.0 volts.

24. The method of claim 21, wherein the simultaneous testing of a page in at least two banks includes writing a test pattern into the selected page and into the cache memory of each of the at least two banks being tested, and comparing the output of the page to the associated cache to look for differences.

25. An apparatus for testing memory devices, comprising:
means for addressing portions of memory elements of the memory devices and separating them into a plurality of memory banks, dividing each memory bank into a plurality of memory pages, and at least one cache memory that is at least as large as a largest one of the plurality of memory pages;
means for programming a test pattern into each one of the plurality of memory pages in each one of the plurality of memory banks, wherein the test pattern is programmed into one memory page and into the cache memory of each one of the plurality of memory banks substantially simultaneously;
means for comparing the test pattern in each memory page to the cache memory for that bank, measuring a programming time for that memory page;
means for storing at least the presence and location of a difference between the memory page and the cache memory, the programming voltage and the programming finish time in a portion of the cache memory of the memory bank; and
means for repeating the test for each one of the plurality of memory pages.

26. The apparatus of claim 25, further comprising input/output means for each of the plurality of memory banks, and means for polling a current state of the testing for each bank at any time in response to an external command.

27. The apparatus of claim 26, further comprising means for adding the measured programming time period for each page to provide a bank programming time period.

28. The apparatus of claim 27, further comprising means for incrementing the programming voltage for each page having a programming time greater than a predetermined value and repeating the test until either a programming time less than the predetermined value is obtained, or a maximum programming voltage is exceeded.

29. The apparatus of claim 28, wherein the predetermined value of is less than 0.5 milliseconds, an initial programming voltage is 17.0 volts, the programming voltage increment is 0.2 volts, and the maximum programming voltage is 20.0 volts.

30. The apparatus of claim 25, further comprising means for replacing memory elements failing the test with at least one redundant memory block in each memory bank, including 64 memory pages per block.

* * * * *

UNITED STATES PATENT AND TRADEMARK OFFICE
CERTIFICATE OF CORRECTION

PATENT NO. : 7,292,487 B1
APPLICATION NO. : 11/382658
DATED : November 6, 2007
INVENTOR(S) : Gatzemeier et al.

Page 1 of 1

It is certified that error appears in the above-identified patent and that said Letters Patent is hereby corrected as shown below:

On the Title page, item (74), in "Attorney, Agent, or Firm", in column 2, line 1, delete "Lunberg" and insert -- Lundberg --, therefor.

Signed and Sealed this

First Day of April, 2008

JON W. DUDAS
*Director of the United States Patent and Trademark Office*